(12) United States Patent
Kosaka et al.

(10) Patent No.: US 11,553,617 B2
(45) Date of Patent: Jan. 10, 2023

(54) POWER CONVERTER

(71) Applicant: DENSO CORPORATION, Kariya (JP)

(72) Inventors: Kazuhiro Kosaka, Kariya (JP); Keisuke Yuki, Toyota (JP)

(73) Assignee: DENSO CORPORATION, Kariya (JP)

(*) Notice: Subject to any disclaimer, the term of this patent is extended or adjusted under 35 U.S.C. 154(b) by 606 days.

(21) Appl. No.: 16/668,621

(22) Filed: Oct. 30, 2019

(65) Prior Publication Data

US 2020/0163245 A1    May 21, 2020

(30) Foreign Application Priority Data

Nov. 21, 2018  (JP) ............................. JP2018-218057

(51) Int. Cl.
| | |
|---|---|
| B62D 5/04 | (2006.01) |
| H05K 7/14 | (2006.01) |
| B60K 6/22 | (2007.10) |
| B60L 50/51 | (2019.01) |
| B60L 15/00 | (2006.01) |
| B60L 50/61 | (2019.01) |
| H02P 27/06 | (2006.01) |
| H02M 7/537 | (2006.01) |
| H02K 11/33 | (2016.01) |
| H05K 7/02 | (2006.01) |
| H02M 7/00 | (2006.01) |
| H02K 17/40 | (2006.01) |
| H02K 47/00 | (2006.01) |

(52) U.S. Cl.
CPC ............. *H05K 7/1432* (2013.01); *B60K 6/22* (2013.01); *B60L 15/007* (2013.01); *B60L 50/51* (2019.02); *B60L 50/61* (2019.02); *H02K 11/33* (2016.01); *H02K 17/40* (2013.01); *H02K 47/00* (2013.01); *H02M 7/003* (2013.01); *H02M 7/537* (2013.01); *H02P 27/06* (2013.01); *H05K 7/023* (2013.01); *B60L 2210/40* (2013.01)

(58) Field of Classification Search
CPC ...... H05K 7/1432; H05K 7/023; H02K 11/33; H02K 17/40; H02K 47/00; B60L 15/007; B60L 2210/40; B62D 5/046
See application file for complete search history.

(56) References Cited

U.S. PATENT DOCUMENTS

| | | | | |
|---|---|---|---|---|
| 2013/0235527 A1* | 9/2013 | Wagner | .................... | H05K 3/30 |
| | | | | 29/832 |
| 2016/0064853 A1* | 3/2016 | Fujimoto | ............... | B62D 5/046 |
| | | | | 439/587 |
| 2017/0355272 A1 | 12/2017 | Baba et al. | | |

FOREIGN PATENT DOCUMENTS

| | | |
|---|---|---|
| JP | 2015-097452 A | 5/2015 |
| JP | 2015-204688 A | 11/2015 |

* cited by examiner

*Primary Examiner* — Cortez M Cook
(74) *Attorney, Agent, or Firm* — Oliff PLC

(57) ABSTRACT

A power convertor has a casing and a power conversion circuit arranged in an internal chamber of the casing. The casing has a first wall member as a specific side wall. A plurality of connector opening parts are formed in the first wall member. At least two of the plurality of connector opening parts formed in the first wall member are arranged at different positions facing a different direction from each other.

9 Claims, 5 Drawing Sheets

POWER CONVERTER

CROSS-REFERENCE TO RELATED APPLICATION

This application is related to and claims priority from Japanese Patent Application No. 2018-218057 filed on Nov. 21, 2018, the contents of which are hereby incorporated by reference.

TECHNICAL FIELD

The present disclosure relates to power convertors.

BACKGROUND

There are known power converters which convert electric power of an electric power source to a drive electric power to be supplied to a drive motor mounted on a motor vehicle. The power converter is arranged on a transaxle arranged at a front compartment of the motor vehicle.

The power converter is covered with a casing. The casing has a bottom wall, side walls and a ceiling wall. The bottom wall is arranged at a bottom side of the power converter. The side walls stand on the bottom wall. The ceiling wall is arranged at the upper side of the side walls to close the power converter and to form a box shape. Various types of connectors have a plurality of opening parts formed in one side wall in the overall side walls. Through the plurality of opening parts of the connectors, the power converter is electrically connected to the drive motor, and the power converter is also electrically connected to a controller.

However, the power converter previously described has the plurality of opening parts formed in one side wall which are open in a vehicle-width direction. This reduces an overall area of the side wall in the vehicle-width direction. That is, this structure often reduces an overall strength of the casing of the power converter.

SUMMARY

It is desired for the present disclosure to provide a power converter having a casing and a power conversion circuit. An internal chamber is formed in the casing. The power conversion circuit is arranged in the internal chamber of the casing. The casing has a first wall member is arranged facing the internal chamber of the casing in a first direction of the casing. The first wall member of the casing has a plurality of connector opening parts. At least two of the plurality of connector opening parts formed in the first wall member are arranged at different positions facing a different direction from each other.

BRIEF DESCRIPTION OF THE DRAWINGS

A preferred, non-limiting embodiment of the present disclosure will be described by way of example with reference to the accompanying drawings, in which.

DETAILED DESCRIPTION OF THE PREFERRED EMBODIMENTS

Figure 1:
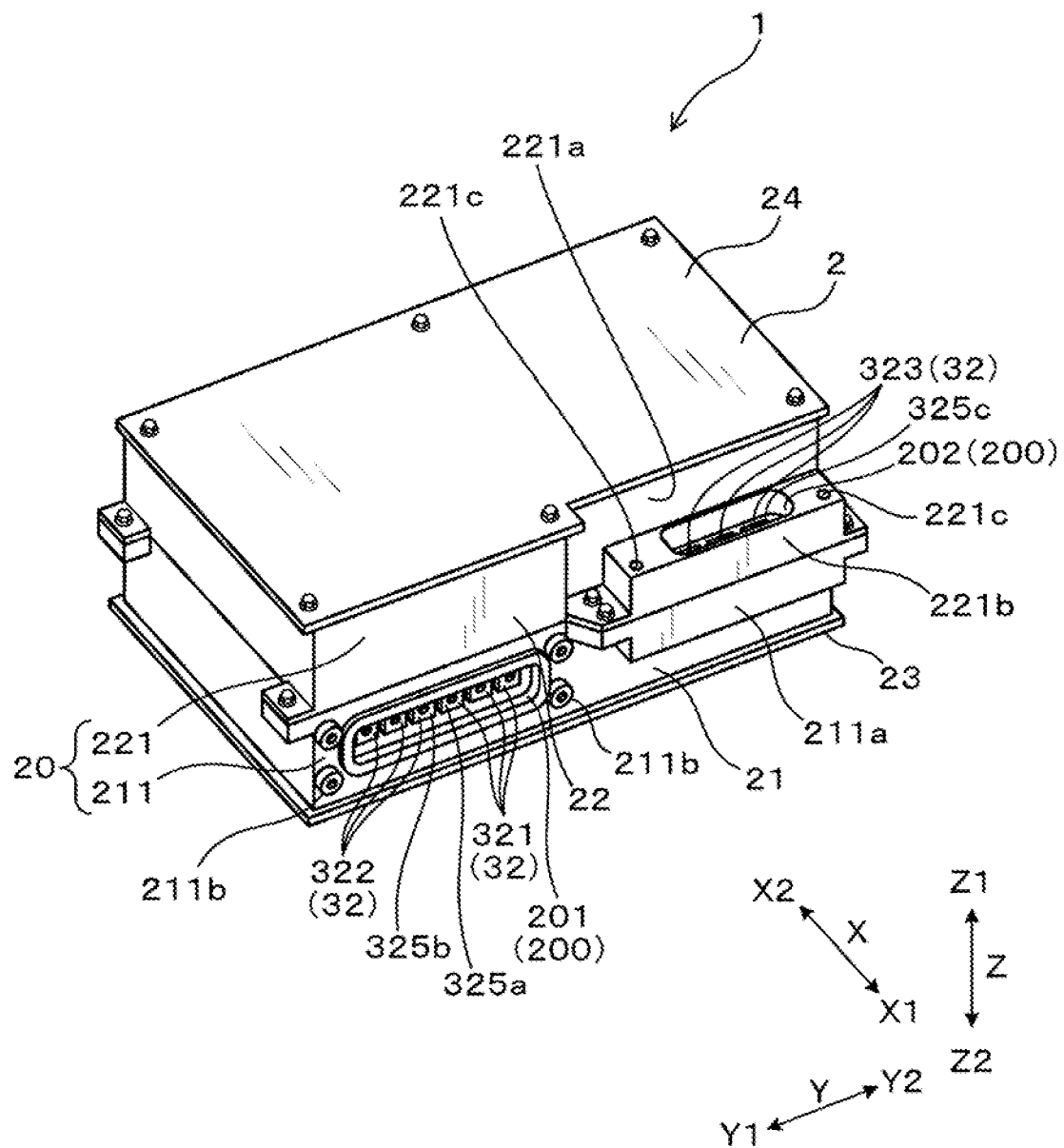
FIG. 1 is a perspective view showing a structure of a power converter according to an exemplary embodiment of the present disclosure.

Hereinafter, various embodiments of the present disclosure will be described with reference to the accompanying drawings. In the following description of the various embodiments, like reference characters or numerals designate like or equivalent component parts throughout the several diagrams.

An Exemplary Embodiment

It is desired for the present disclosure to provide the power converter having a high strength casing in which a plurality of connector opening parts are formed in a side wall of the casing.

A description will be given of a power convertor 1 according to an exemplary embodiment with reference to FIG. 1 to FIG. 5.

FIG. 1 is a perspective view showing a structure of the power converter 1 according to the exemplary embodiment of the present disclosure.

The power converter 1 according to the exemplary embodiment has a casing 2 and a power converter circuit (not shown). The power converter circuit is arranged in an internal chamber of the casing 2. That is, the casing 2 accommodates the power converter circuit.

As shown in FIG. 1, a specific side wall (hereinafter, referred to as the first wall member 20) in the side walls of the casing 2 is arranged facing the internal chamber of the casing 2 in a first direction. The specific side wall will also be referred to as the first wall member 20. The first wall member 20 has a plurality of connector opening parts 200. The number of the connector opening parts 200 is two in the structure of the power converter 1 according to the exemplary embodiment shown in FIG. 1. Through the plurality of connector opening parts 200, external connectors having a different shape are fitted with to being electrically connected to devices in the casing 2. In particular, at least two connector opening parts in the plurality of connector opening parts 200 formed in the first wall member 20 are open facing respective different directions.

The power converter 1 according to the exemplary embodiment is an in-vehicle power converter, for example, to be mounted on hybrid vehicles (not shown), etc. The motor vehicle as a hybrid vehicle is driven by a dual front motor composed of a first front motor and a second front motor. Front wheels are arranged at a front compartment of the motor vehicle. The dual front motor is arranged in the transaxle arranged at the front compartment of the motor vehicle. Rear wheels of the motor vehicle are arranged at a rear side of the motor vehicle. The power converter 1 according to the exemplary embodiment is arranged over the transaxle arranged at the front compartment of the motor vehicle.

The power converter 1 according to the exemplary embodiment is equipped with a booster circuit, three inverters circuits, a DC-DC converter, etc. which are omitted from the drawings.

The booster circuit (not shown) boosts a battery voltage of a battery (not shown), and supplies the boosted battery voltage to three inverter circuits (not shown). Each of the three inverter circuits converts the boosted battery voltage to an alternating current power (AC power).

The three inverter circuits supply the converted AC power to respective three phase AC motors. In more detail, the three inverter circuits correspond to a first inverter circuit, a second inverter circuit and a third inverter circuit. The first inverter circuit supplies the respective AC power to the first front motor. The second inverter circuit supplies the AC power to the respective second front motor. The third inverter circuit supplies the respective AC power to the rear motor.

The DC-DC inverter circuit reduces the battery voltage of the battery, and supplies the reduced battery voltage to a low voltage battery. That is, the low voltage battery is changed by the reduced battery voltage. In the power converter 1 according to the exemplary embodiment, the casing 2 accommodates the booster circuit, the first to third inverters circuits, the DC-DC converter, etc.

Figure 2:
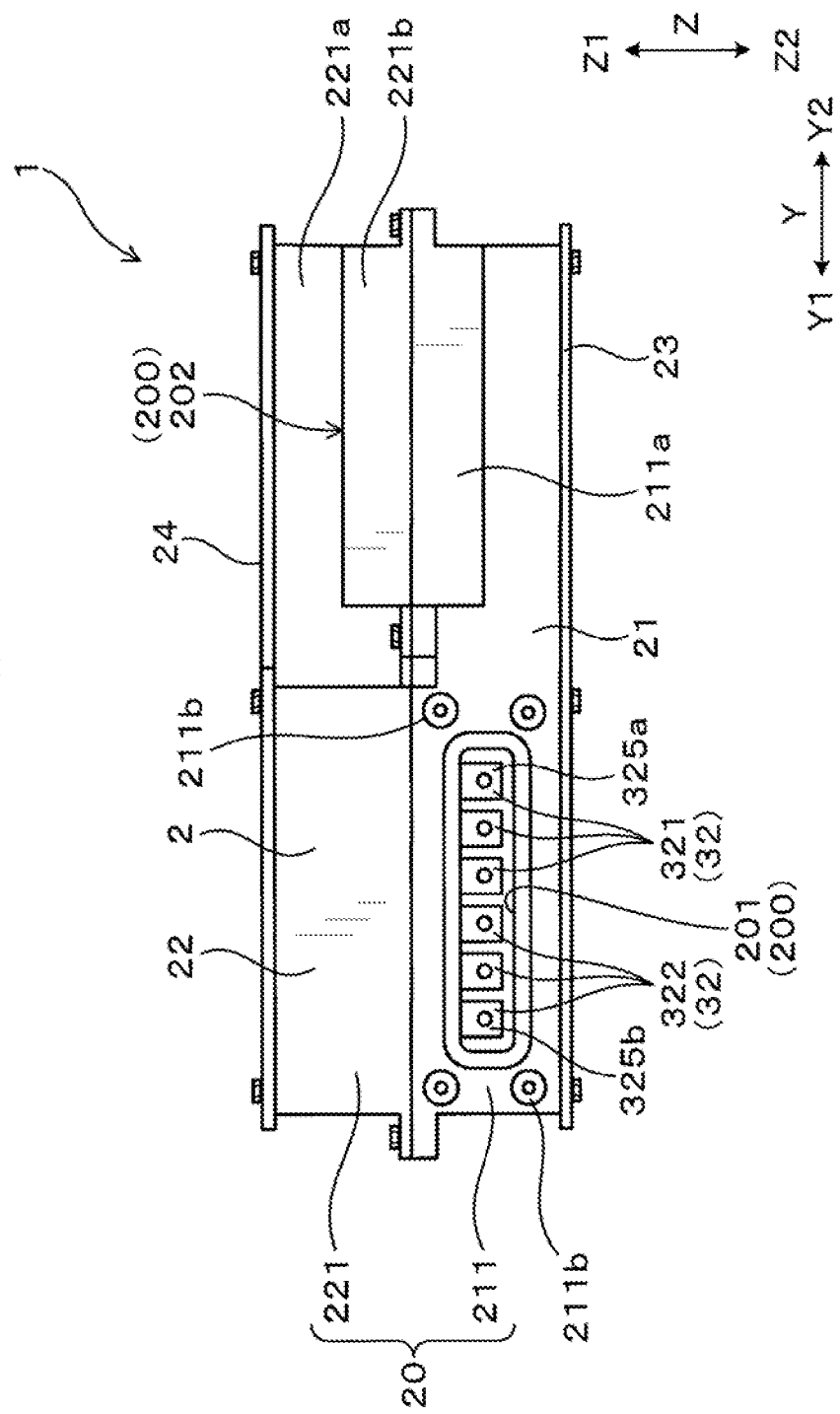
FIG. 2 is a front view showing the structure of the power converter according to the exemplary embodiment of the present disclosure.
Figure 3:
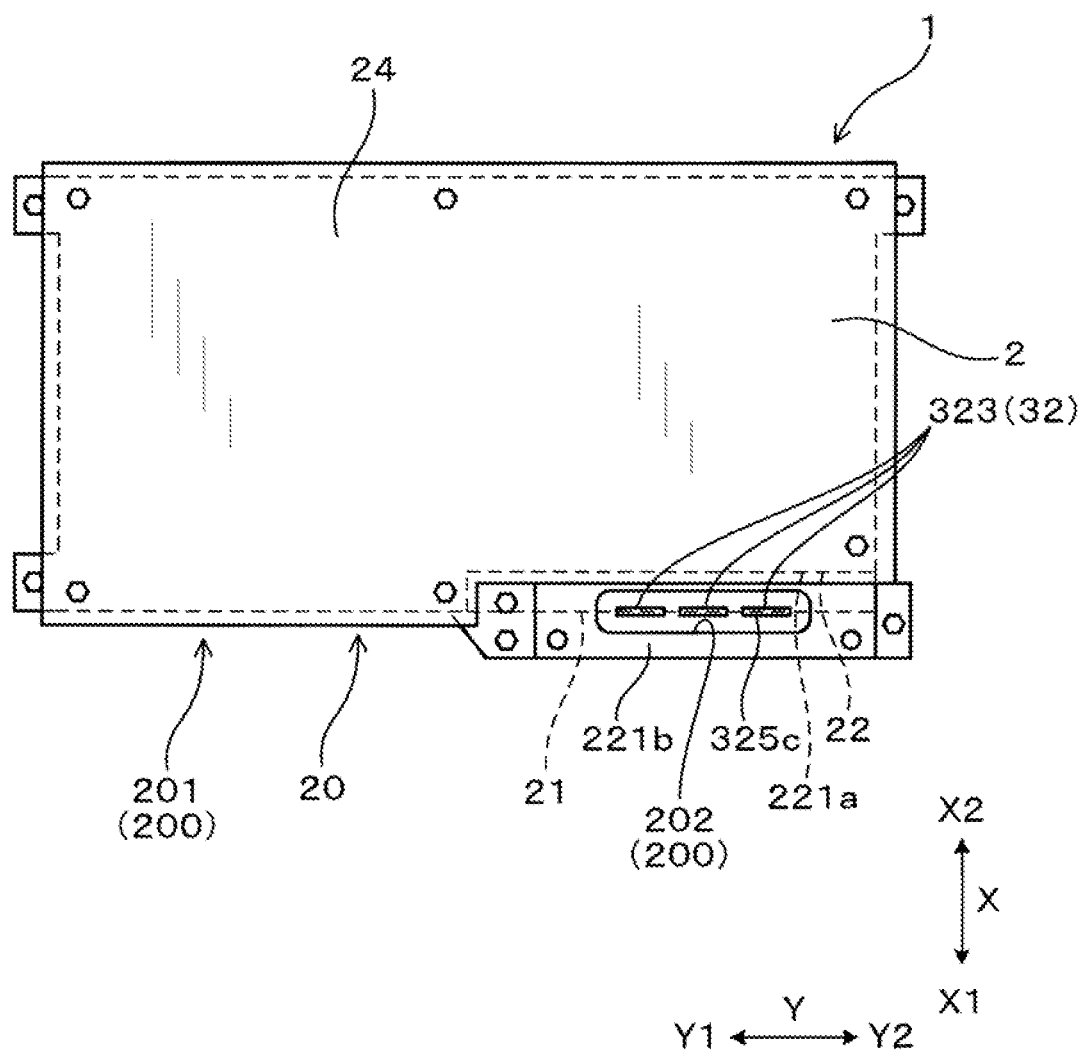
FIG. 3 is a plan view showing the structure of the power converter according to the exemplary embodiment of the present disclosure.
Figure 4:
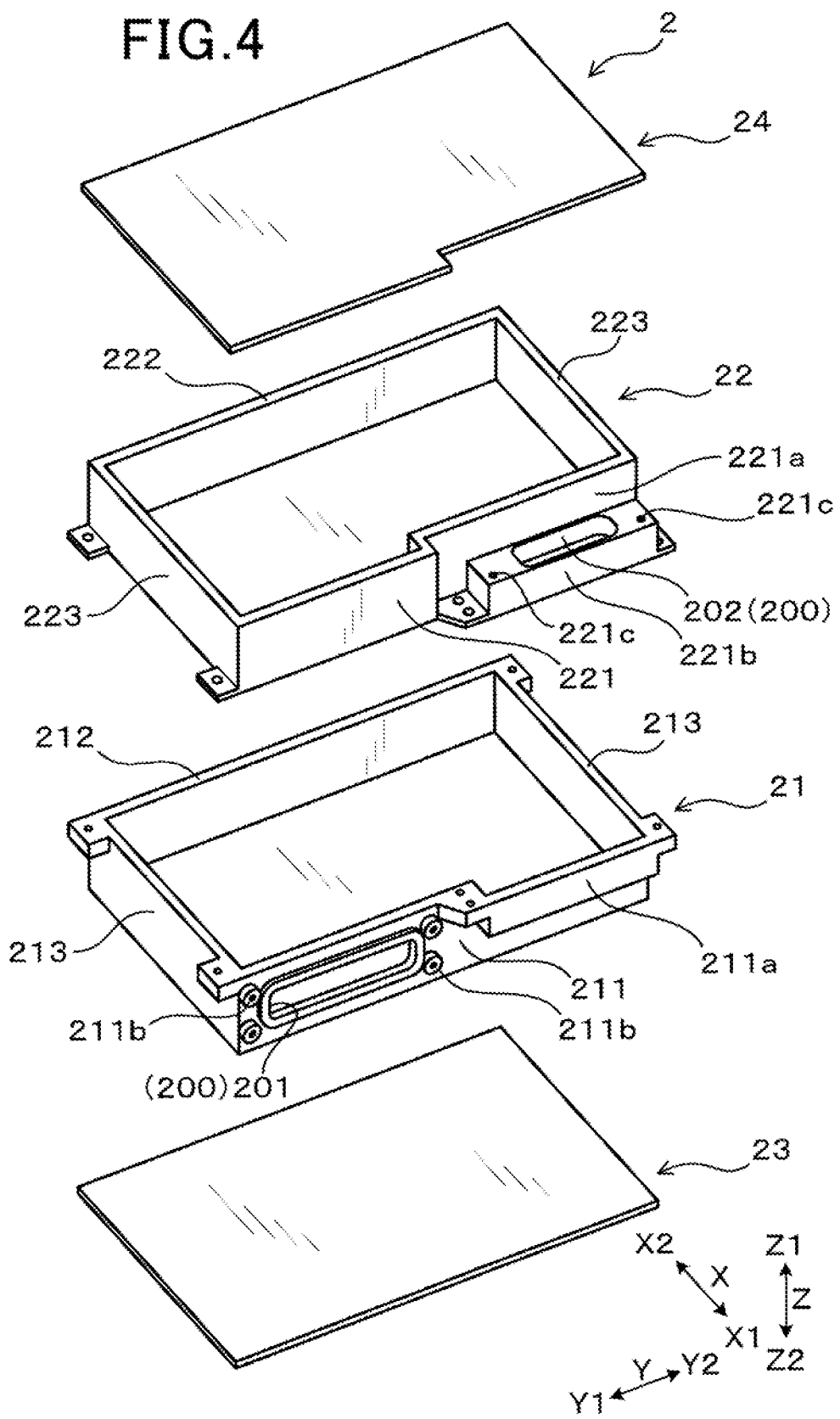
FIG. 4 is an exploded perspective view showing a structure of a casing in the power converter according to the exemplary embodiment of the present disclosure.

FIG. 2 is a front view showing the structure of the power converter 1 according to the exemplary embodiment. FIG. 3 is a plan view showing the structure of the power converter 1 according to the exemplary embodiment. FIG. 4 is an exploded perspective view showing a structure of the casing 2 in the power converter 1 according to the exemplary embodiment.

As shown in FIG. 1, FIG. 2 and FIG. 4, the casing 2 has a rectangular box shape. The casing 2 is composed of a plurality of wall members. That is, the casing 2 is composed of a bottom wall member 23, a first casing member 21, a second casing member 22 and a ceiling wall member 24 which are stacked in order in a stacking Z direction.

In the stacking Z direction shown in FIG. 4, the Z1 side corresponds to the ceiling wall member 24 side viewed from the bottom wall member 23 side. The Z2 side is opposite to the Z1 side in the stacking direction Z.

As shown in FIG. 4, when viewed from the stacking direction Z, a short side of the casing 2 corresponds to X direction. A longitudinal direction of the casing 2 corresponds to a Y direction.

As shown in FIG. 1, the X direction is a facing direction through which the internal chamber of the casing 2 faces the first wall member 20. The X1 side is opposite to the X2 side in the X direction.

As shown in FIG. 1, the first wall member 20 is formed at the X1 side in the X direction.

As shown in FIG. 1 and FIG. 2, the Y1 side is opposite to the Y2 side in the Y direction. A first opening part is formed at the Y1 side of the casing 2. The first opening part will be explained later in detail. Similarly, a second opening part is formed at the Y2 side of the casing 2. The second opening part will be explained later in detail.

As shown in FIG. 4, the X direction, the Y direction and the Z direction are orthogonal to each other.

As shown in FIG. 4, the first casing member 21 and the second casing member 22 are arranged so that the internal chamber of the casing 2 is accommodated in the X direction and the Y direction by the first casing member 21 and the second casing member 22. Although FIG. 4 shows an outer frame of the first casing member 21 and an outer frame of the second casing member 22. However, it is acceptable to arrange partition walls in the inside of the first casing member 21 and the second casing member 22.

As shown in FIG. 1, FIG. 2 and FIG. 4, a bottom side opening part of the first casing member 21 arranged at the Z2 side is covered with the bottom wall member 23. An upper side opening part of the second casing member 22 arranged at the Z1 side is covered with the ceiling wall member 24.

The first casing member 21 is fixed to the bottom wall member 23 by screw members (for example, bolts and female screws, etc. not shown). Similarly, the second casing member 22 is fixed to the ceiling wall member 24 by screw members (for example, bolts and female screws, etc. not shown). Those screw members are omitted from FIG. 4.

As shown in FIG. 4, the first casing member 21 has a first front wall 211 and a first rear wall 212 and a pair of first side walls 213. The first front wall 211 faces the first rear wall 212 in the X direction. The pair of first side walls 213 face from each other in the Y direction. The first front wall 211 is arranged at the X1 side of the first rear wall 212. It is acceptable to arrange the power converter 1 at a desired location in the motor vehicle, and to rearrange those walls forming the first casing member 21 according to a structural requirement.

As shown in FIG. 4, the second casing member 22 has a second front wall 221 and a second rear wall 222 and a pair of second side walls 223. The second front wall 221 faces the second rear wall 222 in the X direction. The pair of second side walls 223 face from each other in the Y direction. The second front wall 211 is arranged at the X1 side of the second rear wall 222. It is acceptable to arrange the power converter 1 at a desired location in the motor vehicle and to rearrange those walls forming the second casing member 22 according to a structural requirement.

In the Z direction, the first front wall 211 and the second front wall 221 are located substantially at the same location, and the first rear wall 212 and the second rear wall 222 are located substantially at the same location. Similarly, the pair of first side walls 213 and the pair of second side walls 223 are arranged substantially at the same location. The second casing member 22 is fixed to the first casing member 21 by using bolts.

As shown in FIG. 1, in the structure of the power converter 1 according to the exemplary embodiment, the first front wall 211 of the first casing member 21 and the second front wall 221 of the second casing member 22 form the first wall member 20.

The two connector opening parts 200 are formed in the first wall member 20. The two connector opening parts 200 are open facing respective different directions. Each of the connector opening parts 200 is a terminal formed in the casing 2, and open toward a terminal of an external device to be connected to the power converter 1. One of the two connector opening parts 200 has a first opening part 201, and the other has a second opening part 202.

As shown in FIG. 1, FIG. 2 and FIG. 4, the first opening part 201 is formed in the first casing member 21, and the second opening part 202 is formed in the second opening part 202. That is, the first opening part 201 and the second opening part 202 are formed in the different member, and the first opening part 201 and the second opening part 202 are open facing different directions from each other.

As shown in FIG. 1, FIG. 2 and FIG. 4, the first opening part 201 is formed in the first front wall 211 at the Y1 side of the Y direction. The first opening part 201 penetrates the first front wall 211 in the X direction. The first opening part 201 is formed opening toward the X direction. The first opening part 201 substantially has a rectangular shape having a long side in the Y direction and a short side in the Z direction.

When the power converter 1 is mounted on a motor vehicle, the first wall member 20 as the specific side wall is arranged at one side in the direction which is intersected in the vertical direction, i.e. the Z direction, and the first opening part 201 is open facing the vertical direction.

As shown in FIG. 1 and FIG. 4, a member arrangement part 211a is formed at the Z1 side on the surface of the first opening part 201 of the first front wall 211 so that the member arrangement part 211a projects toward the X2 side in the X direction.

As shown in FIG. 4, the member arrangement part 211a has a box shape opening in the X2 side and the Z1 side.

As shown in FIG. 1 to FIG. 4, the second front wall 221 has a recessed part 221a which is recessed toward the X2 side. The recessed part 221a is recessed toward the X2 side more than the surrounding parts of the recessed part 221a in the second front wall 221.

The recessed part 221a is formed at the Y2 side in the second front wall 221. The area of the second front wall 221 at the Y1 side of the recessed part 221a is formed at the X2 side more than the area at the Y2 side of the recessed part 221a. The recessed part 221a is recessed toward the X2 side more than the end part at the X1 side of the first opening part 201.

As shown in FIG. 1, FIG. 2 and FIG. 4, an opening formation part 221b projects toward the X1 side from the end part at the Z2 side of the recessed part 221a. The opening formation part 221b forms a part of the second front wall 221.

The opening formation part 221b is formed overlapped with the member arrangement part 211a in the Z direction. The opening formation part 221b has a box shape opening toward the Z2 side. An internal chamber of the opening formation part 221b communicates with an internal chamber of the inside of the member arrangement part 211a.

A part of a terminal module 3 is arranged in the internal chamber of the opening formation part 221b and the internal chamber of the recessed part 211a. The terminal module 3 will be explained later.

As shown in FIG. 1, FIG. 3 and FIG. 4, the second opening part 202 is formed in the opening formation part 221b so as to penetrate in the opening formation part 221b at the Z1 side. That is, as shown in FIG. 4, the second opening part 202 is arranged opening in the Z direction.

When the power converter 1 is mounted on a motor vehicle, the second opening part 202 is arranged opening in the Z direction, i.e. toward the upper side in the vertical direction of the motor vehicle. The opening direction (i.e. the X direction) of the first opening part 201 is perpendicular to the opening direction (i.e. the Z direction) of the second opening part 202 from each other. The second opening part 202 substantially has a rectangle shape having a long side in the Y direction and a short side in the X direction.

As shown in FIG. 1, the second opening part 202 is arranged at the Y2 side more than the first opening part 201. That is, the first opening part 201 and the second opening part 202 are arranged at a different location in the power converter 1.

As shown in FIG. 1, FIG. 3 and FIG. 4, at least a part of the second opening part 202 is arranged inside of the recessed part 221a. That is, at least a part of the second opening part 202 is arranged at the X2 side more than the second front wall 221 excepting the recessed part 221a.

Figure 5:
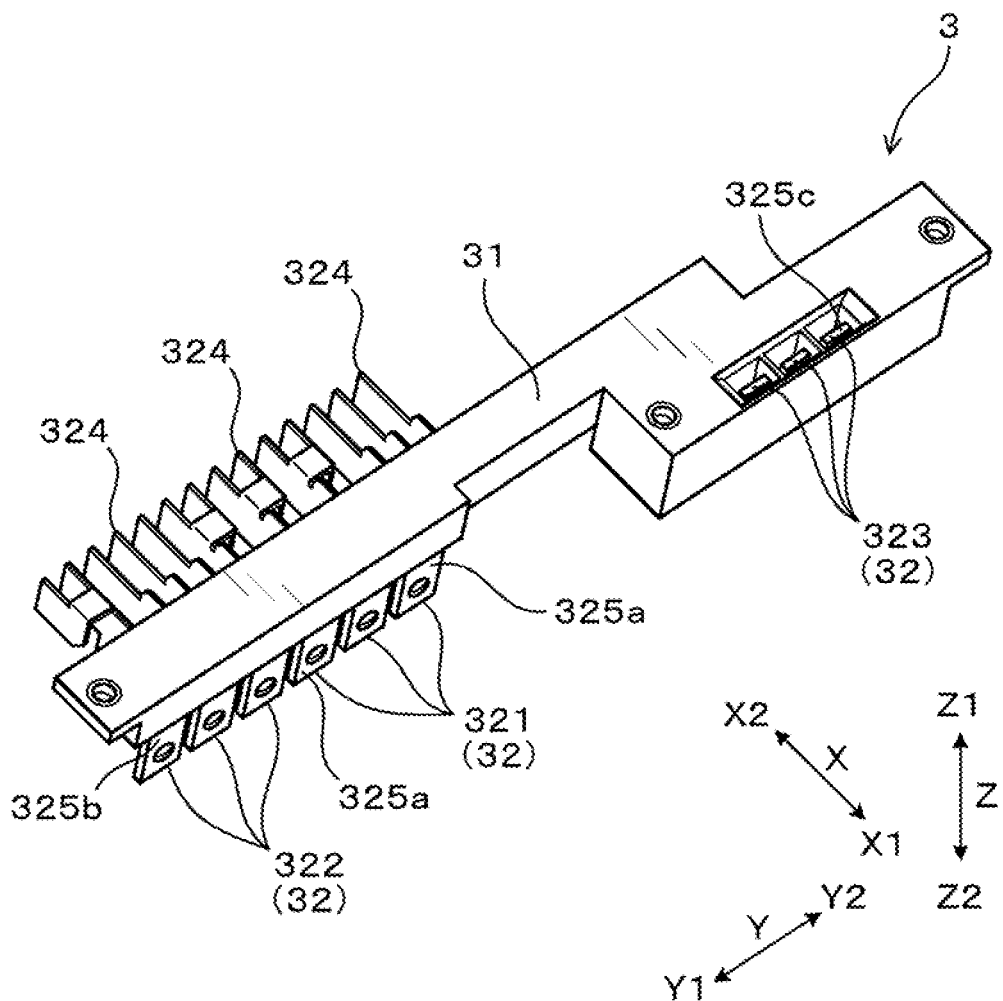
FIG. 5 is a perspective view showing a structure of a terminal module arranged in the power converter according to the exemplary embodiment of the present disclosure.

FIG. 5 is a perspective view showing a structure of the terminal module 3 arranged in the power converter 1 according to the exemplary embodiment of the present disclosure.

As shown in FIG. 1 and FIG. 5, the terminal module 3 is arranged in the internal chamber of the casing 2. A plurality of terminals are formed in the terminal module 3 to be exposed outside through the first opening part 201 and the second opening part 202. The terminals are assembled to the terminal module 3 as a monolithic member. It is possible to recognize the terminals of the terminal module 3 from the outside of the casing 2.

As shown in FIG. 5, the terminal module 3 is composed of a mold resin 31 and a plurality of bus bars 32. The plurality of bus bars 32 are embedded in the mold resin 31. The terminal module 3 has a monolithic structure formed by insert molding. That is, the insert molding feeds the mold resin 31 in the plurality of bus bars 32 arranged at predetermined intervals.

As shown in FIG. 5, the plurality of bus bars 32 in the terminal module 3 are composed of a first bus bar 321, a second bus bar 322 and a third bus bar 323. The first inverter circuit supplies the AC power to the first front motor through the first bus bar 321. The second inverter circuit supplies the AC power to the second front motor through the second bus bar 322. Similarly, the third inverter circuit supplies the AC power to the third front motor through the third bus bar 323.

As shown in FIG. 5, the bus bars 32 in the terminal module 3 have respective inside terminals 324a, 324b and 324c and respective outside terminals 325a, 325b and 325c. The outside terminals 325a, 325b and 325c are connected to output terminals of one or more semiconductor modules (not shown) forming the inverter circuit. Specifically, the inside terminal 324a of the first bus bar 321 of the three phases is connected to the output terminal of the respective semiconductor module in the three phase semiconductor modules in the first inverter circuit. The inside terminal 324b of the second bus bar 322 of the three phases is connected to the output terminal of the respective semiconductor module in the three phase semiconductor modules in the first inverter circuit. Similarly, the inside terminal 324c of the third bus bar 323 of the three phases is connected to the output terminal of the respective semiconductor module in the three phase semiconductor modules in the first inverter circuit.

The output terminals of the semiconductor modules connected to the inside terminals 324 (324a, 324b and 324c) are arranged straight in the Y direction. The inside terminals 324 and the output terminals of the semiconductor modules are connected in an arrangement (or a thickness) direction of the inside terminals 324, i.e. in the Y direction.

As shown in FIG. 1 and FIG. 2, the outside terminal 325a of the first bus bar 321 and the outside terminal 325b of the second bus bar 322 are exposed from the first opening part 201. The outside terminal 325c of the third bus bar 323 is exposed from the second opening part 202.

A first connector (not shown) of a first wiring is fixed to the casing 2. The transaxle is connected to the power converter 1 through the first connector of the first wiring. The terminals of the first connector are connected to the outside terminal 325a of the first bus bar 321, the outside terminal 325b of the second bus bar 322 and the outside terminal 325c of the third bus bar 323.

As shown in FIG. 1, FIG. 2 and FIG. 4, a fixed part 211b, projecting toward the X1 side is formed in the outer periphery of the first opening part 201. The first connector is fixed to a female screw formed in the fixed part 211b in the X direction. That is, the first opening part 201 and the first connector fixed to the first opening part 201 are arranged in the X direction.

A second connector (not shown) of a second wiring is fixed to the casing 2. The rear motor is connected to the power converter 1 through the second connector of the second wiring. The terminals of the second connector are connected to the outside terminal 325c of the third bus bar 323. The second connector is fixed in the Z direction to a female screw formed at both end parts in the Y direction of the second opening part 202. That is, the second opening part 202 and the second connector fixed to the second opening part 202 are arranged in the Z direction. The second opening part 202 and the second connector are connected together in the Z direction.

The connection direction (i.e. the X direction) between the first opening part 201 and the first connector is orthogonal to the connection direction (i.e. Z direction) between the second opening part 202 and the second connector.

A description will be given of behavior and effects of the power converter 1 according to the exemplary embodiment.

In the structure of the power converter 1 according to the exemplary embodiment, at least two of the plurality of connector opening parts 200 formed in the specific side wall, i.e. the first wall member 20 are open facing a different direction. This improved structure makes it possible to prevent the area of the specific side wall as the first wall member 20 from being reduced in the X direction 1 side. This structure makes it possible to maintain a strength of the specific side wall as the first wall member 20, and to maintain an overall strength of the casing 2 in the power converter 1.

Further, in the structure of the power converter 1 according to the exemplary embodiment, the terminals formed in the terminal module 3 arranged in the internal chamber of the casing 2 are exposed outside from the plurality of connector opening parts. Those terminals are formed in the specific side wall as the first wall member 20 and open facing respective different directions. This improved structure makes it possible to reduce the number of components in the casing 2 and to reduce the overall size of the casing 2 because the plurality of connectors connected to the respective connector opening parts 200 are electrically connected to the terminal module 3 as a monolithic member arranged in the internal chamber of the casing 2.

Further, the plurality of connector opening parts 200, which are open facing a different direction, formed in the specific side wall as the first wall member 20 are formed in the different casing members, i.e. in the first casing member 21, the second casing member 22 and the third casing member 23. This makes it possible to reduce the overall area of those opening parts formed in the casing 2 and to increase the overall strength of the casing 2.

In the structure of the power converter 1 according to the exemplary embodiment, the first opening part 201 is formed in the X direction as the facing direction to which the internal chamber of the casing 2 faces the specific side wall as the first wall member 20, and the second opening part 202 is formed opening in a direction which is orthogonal to the X direction.

The specific side wall as the first wall member 20 has the recessed part 221a which is recessed to toward the internal chamber of the casing 2 in the X direction. Further, at least a part of the second opening part 202 is arranged inside of the recessed part 221a. This structure prevents the second opening part 202 from projecting outside in the X direction, and allows the overall size of the casing 3 to be reduced.

When the power converter 1 according to the exemplary embodiment is mounted on a motor vehicle, the power converter 1 is arranged at the upper side of the transaxle of the motor vehicle. This arrangement allows the power converter 1 to be arranged on the front compartment of the motor vehicle after the power converter 1 is assembled with the transaxle through the first wiring.

After the power converter 1 is mounted on the motor vehicle, the specific side wall as the first wall member 20 is arranged at one side in the direction with which the specific side wall as the first wall member 20 is intersected, and the first opening part 201 is open toward this side. This arrangement makes it possible to easily reduce the length of the first wiring.

Further, after the power converter 1 is mounted on the motor vehicle, the second opening part 202, which is open toward the upper side of the vertical direction, is connected to the second connector of the second wiring through which the power converter 1 is connected to the rear motor of the motor vehicle.

In general, because a rear motor is arranged at a location which is far from the location of a usual power converter, it becomes difficult to assemble the usual power converter and the rear motor together in a motor vehicle after the usual power converter is connected to the rear motor through the second wiring.

On the other hand, because the power converter 1 according to the exemplary embodiment has the improved structure in which the second opening part 202 is open toward the upper side, it is possible to easily connect the second connector of the second wiring to the second opening part 202 after the power converter 1 is arranged in the front compartment of the motor vehicle.

As previously described in detail, the present disclosure provides the power converter 1 in which the casing 2 has a string strength eve if the plurality of connector opening parts 200 are formed in the specific side wall, i.e. the first wall member 20.

The concept of the present disclosure is not limited by the exemplary embodiment previously described. For example, it is acceptable to form additional opening in addition to the first opening part 201 and the second opening part 202 in the specific side wall as the first wall member 20 of the casing 2. It is acceptable to form the additional opening which is open toward a different opening direction which is different from the opening direction of the first opening part 201 or the second opening part 202, or toward the same opening direction of the first opening part 201 or the second opening part 202.

It is acceptable to insert a tool into the connector opening parts so as to connect the power converter 1 with an external device by a bolt fastening.

While specific embodiments of the present disclosure have been described in detail, it will be appreciated by those skilled in the art that various modifications and alternatives to those details could be developed in light of the overall teachings of the disclosure. Accordingly, the particular arrangements disclosed are meant to be illustrative only and not limited to the scope of the present disclosure which is to be given the full breadth of the following claims and all equivalents thereof.

What is claimed is:
1. A power convertor comprising:
   a casing in which an internal chamber is formed; and
   a power conversion circuit arranged in the internal chamber of the casing,
   wherein
   the casing comprises a first wall member that faces the internal chamber of the casing in a first direction of the casing,
   the first wall member comprises a plurality of connector opening parts, and at least two of the plurality of connector opening parts (i) are arranged at different positions from each other and (ii) are open facing different opening directions from each other.

2. The power converter according to claim 1, wherein a plurality of outside terminals of a monolithic member arranged in the internal chamber of the casing are exposed outside of the casing through the plurality of connector opening parts, which are open facing different opening directions, formed in the first wall member.

3. The power converter according to claim 1, wherein the casing is composed of a plurality of casing members which form the first wall member, and the plurality of connector opening parts, which are open facing different opening directions, are formed in two or more of the plurality of casing members.

4. The power converter according to claim 2, wherein the casing is composed of a plurality of casing members which form the first wall member, and the plurality of connector opening parts, which are open facing different opening directions, are formed in two or more of the plurality of casing members.

5. The power converter according to claim 1, wherein the at least two of the plurality of connector opening parts comprises a first connector opening part and a second connector opening part, the first connector opening part opening in a facing direction along which the internal chamber of the casing faces the first wall member, the second connector opening part opening in a direction which is orthogonal to the facing direction, the first wall member comprises a recessed part which is recessed toward the internal chamber of the casing in the facing direction, and at least a part of the second connector opening part is arranged in the recessed part.

6. The power converter according to claim 2, wherein the at least two of the plurality of connector opening parts comprises a first connector opening part and a second connector opening part, the first connector opening part opening in a facing direction along which the internal chamber of the casing faces the first wall member, the second connector opening part opening in a direction which is orthogonal to the facing direction, the first wall member comprises a recessed part which is recessed toward the internal chamber of the casing in the facing direction, and at least a part of the second connector opening part is arranged in the recessed part.

7. The power converter according to claim 3, wherein the at least two of the plurality of connector opening parts comprises a first connector opening part and a second connector opening part, the first connector opening part opening in a facing direction along which the internal chamber of the casing faces the first wall member, the second connector opening part opening in a direction which is orthogonal to the facing direction, the first wall member comprises a recessed part which is recessed toward the internal chamber of the casing in the facing direction, and at least a part of the second connector opening part is arranged in the recessed part.

8. The power converter according to claim 4, wherein the at least two of the plurality of connector opening parts first wall member comprises a first connector opening part and a second connector opening part, the first connector opening part opening in a facing direction along which the internal chamber of the casing faces the first wall member, the second connector opening part opening in a direction which is orthogonal to the facing direction, the first wall member comprises a recessed part which is recessed toward the internal chamber of the casing in the facing direction, and at least a part of the second connector opening part is arranged in the recessed part.

9. A power convertor comprising:

a casing in which an internal chamber is formed; and a power conversion circuit arranged in the internal chamber of the casing, wherein the casing comprises a first wall member that faces the internal chamber of the casing in a first direction of the casing, the first wall member comprises a plurality of connector opening parts, at least two of the plurality of connector opening parts are arranged at different positions and face different directions from each other, the casing is composed of a plurality of casing members which form the first wall member, and the plurality of connector opening parts, which are open facing different opening directions, are formed in two or more of the plurality of casing members.

* * * * *